United States Patent [19]

Takahashi et al.

[11] Patent Number: 4,778,772
[45] Date of Patent: Oct. 18, 1988

[54] METHOD OF MANUFACTURING A BIPOLAR TRANSISTOR

[75] Inventors: Kouichi Takahashi; Hidekuni Ishida, both of Yokohama; Toshio Yonezawa, Yokosuka, all of Japan

[73] Assignee: Kabushiki Kaisha Toshiba, Kawasaki, Japan

[21] Appl. No.: 22,240

[22] Filed: Mar. 5, 1987

Related U.S. Application Data

[62] Division of Ser. No. 208,399, Nov. 19, 1980, Pat. No. 4,667,218, which is a division of Ser. No. 123,276, Feb. 21, 1980, Pat. No. 4,263,067, which is a division of Ser. No. 910,409, May 30, 1978, Pat. No. 4,226,650.

[30] Foreign Application Priority Data

Jun. 9, 1977 [JP] Japan .................... 52-67307

[51] Int. Cl.$^4$ .................... H01L 21/385; H01L 21/425
[52] U.S. Cl. .................... 437/31; 437/151; 437/191
[58] Field of Search .................... 437/31, 151, 191

[56] References Cited

U.S. PATENT DOCUMENTS

| | | | |
|---|---|---|---|
| 3,607,449 | 9/1971 | Tokuyama et al. | 437/20 X |
| 3,704,178 | 11/1972 | Hill | 437/20 X |
| 3,756,873 | 9/1973 | Kaiser | 437/961 X |
| 3,812,519 | 5/1974 | Nakamura et al. | 437/961 X |
| 3,834,953 | 9/1974 | Nakamura et al. | 437/151 |
| 4,006,046 | 2/1977 | Pravin | 437/961 X |
| 4,226,650 | 10/1980 | Takahashi et al. | 437/961 X |
| 4,263,067 | 4/1981 | Takahashi et al. | 437/961 X |
| 4,667,218 | 5/1987 | Takahashi et al. | 437/961 X |

*Primary Examiner*—George T. Ozaki
*Attorney, Agent, or Firm*—Oblon, Fisher, Spivak, McClelland & Maier

[57] ABSTRACT

A method of manufacturing a semiconductor device by forming an N type collector layer in an N type semiconductor wafer, a P type base layer which is in contact with the N type collector layer at a PN junction that extends to the surface and which contains an N type impurity material of which the energy of combination with vacancies is great and boron which is a P type impurity material, and an N type emitter layer which is so formed as to be surrounded by this P type base layer and forms a transistor together with the N type collector layer and the P type base layer and which contains the N type impurity materials phosphorous and arsenic. Arsenic or antimony or the like, which are N type impurity material of which the energy of combination with vacancies is great are diffused in the P type base layer.

8 Claims, 2 Drawing Sheets

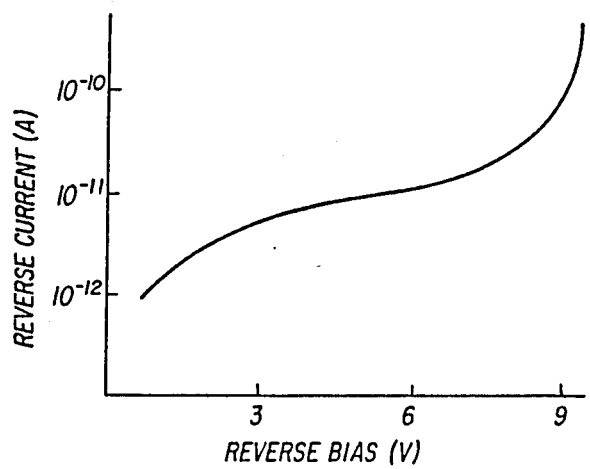
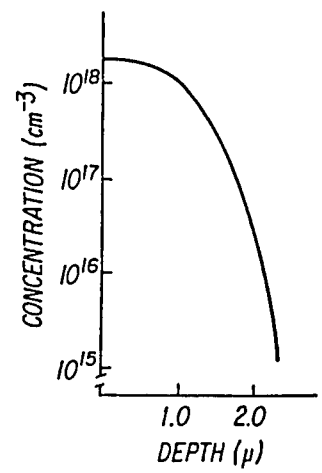
FIG.4 PRIOR ART
FIG.5
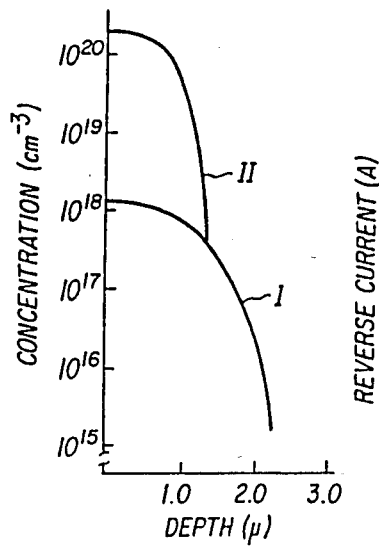
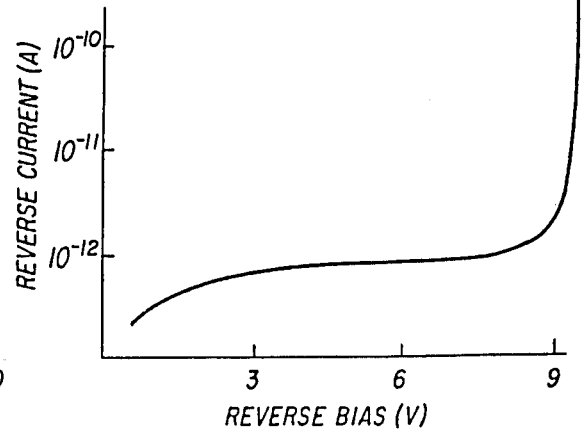
FIG.6
FIG.7

METHOD OF MANUFACTURING A BIPOLAR TRANSISTOR

This is a divisional application of Ser. No. 208,399 filed Nov. 19, 1080 now U.S. Pat. No. 4,667,218, which is a division of application U.S. Ser. No. 06/123,276 filed Feb. 21, 1980, now U.S. Pat. No. 4,263,067, which is a division of application Ser. No. 05/910,409 filed May 30, 1978, now U.S. Pat. No. 4,226,650.

BACKGROUND OF THE INVENTION

This invention relates to a semiconductor device in which an N type impurity is diffused in a P type base layer of an NPN type transistor of vertical structure, and to a method of manufacturing this device.

In the past, N type silicon wafers 1 have been used to make NPN type transistors of vertical structure. First of all, a boron doped silicate glass (BSG) layer is deposited on the exposed part of an N type silicon wafer provided with an opening in silicon oxide, and then a chemical vapor deposition (CVD) layer is deposited on this BSG layer. This silicon wafer is heat treated, whereby the boron doped in this BSG layer is diffused in the N type silicon wafer and a P type base layer is formed. Next, a coating of silicon oxide 8 is made to adhere to the whole surface of this N type silicon wafer, and in this silicon oxide layer the silicon oxide layer covering the P type base layer is removed. After that, this wafer is subjected to heat treatment in a gaseous mixture of phosphorus (P) and arsenic (As) and an N type emitter layer is formed in the P type base layer. After this, electrodes 6, 7 are formed in the P type base layer and the N type emitter layer of the N type silicon wafer and this N type silicon wafer is divided and silicon pellets are obtained. When this prior art NPN type transistor is made, an emitter dip region is formed in the base region of this NPN type transistor, that is to say the emitter dip phenomenon appears. The emitter dip region 5 is shown in FIG. 1.

When phosphorus (P) and arsenic (As) are diffused from the exposed part of the N type silicon wafer 2 in which the P type base layer 3 has been formed and from which silicon oxide has been removed, so that the N type emitter layer 4 is formed in the P type base layer 3, the vacancies V which are a defect present in the surface of the N type silicon wafer become $(P^- - V^=)$ pairs with the phosphorus (P), and these $(P - V^=)$ and phosphorus (P) are diffused in the direction of the depth of the N type silicon wafer in which the phosphorus (P) is diffused. Near the boundary of the P type base layer 3 in which the phosphorus concentration is low and the emitter layer 4, these $(P - V^=)$ pairs dissociate into $(P^+ - V^\circ)$ pairs, and these further dissociate into $P^+$ and $V^\circ$. When these dissociated vacancies $V^\circ$ increase in the vicinity of the boundary of the P type base layer 3 and the N type emitter layer 4, the coefficient of diffusion of the boron (B) of the P type base layer 3 in the neighborhood of this boundary, that is to say in the tail region, becomes great and the emitter dip region 5 is formed in the base region of the transistor. Electric field concentration readily occurs in this emitter dip region, and the voltage resistance of this NPN type transistor is impaired. Also, numerous vacancies V present in the base layer and in the vicinity of the emitter dip region become recombination centers, and the "fluctuation effect" occurs whereby the current flowing in this NPN transistor constantly fluctuates, and this therefore became a cause of noise in this semiconductor device.

SUMMARY OF THE INVENTION

Accordingly, one object of the present invention is to provide a semiconductor device having satisfactory electrical characteristics and a method of manufacturing such a semiconductor device.

Another object of the present invention is to provide a method of manufacturing a semiconductor device in which the phenomenon of emitter dip is prevented and whih has satisfactory electrical characteristics.

Another object of the present invention is to provide a semiconductor device in which the P type base layer contains an N type impurity material in a low concentration, whereby the PN impurity concentration distribution in the direction of the depth of the P type base layer is made substantially uniform, and a method of manufacturing the device.

Another object of the present invention is to provide a semiconductor device in which arsenic which is an N type impurity material is diffused down to a deep region in the direction of the depth of the N type emitter layer, whereby crystal strains are relaxed down to a deep region, and a method of manufacturing this device.

The objects of the present invention are achieved by semiconductor device comprising an N type collector layer formed in an N type semiconductor wafer having a substantially flat surface, a P type base layer which is in contact with the N type collector layer at a PN junction extending to the above-mentioned surface and which contains a N type impurity material of which the energy of combination with vacancies is great and boron which is a P type impurity material, and an N type emitter layer of which a PN junction is so formed as to be surrounded by this P type base layer and extends to the above-mentioned surface and which forms a transistor together with the N type collector layer and P type base layer and which contains phosphorus and arsenic which are N type impurity materials.

Also, in another aspect, the objects of the present invention are also achieved by a method of manufacturing a semiconductor device comprising a step in which in an N type collector layer formed in an N type semiconductor wafer having a substantially flat surface, an N type impurity of which the energy of combination with vacancies is great, and boron which is a P type impurity material, are diffused from an opening in an insulating layer covering the N type collector layer, and a P type base layer in contact with the N type collector layer at a PN junction extending to the above-mentioned surface is covered with an insulating layer, and an exposed part smaller than the above-mentioned opening is formed on the P type base layer, and a step in which phosphorus and arsenic which are N type impurity materials are diffused from the above-mentioned exposed part into the P type base layer so that an N type emitter layer is formed which is in contact with the P type base layer at a PN junction extending to the above-mentioned surface and which constitutes a transistor together with the N type collector layer and the P type base layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a characteristic diagram of the reverse voltage resistance of a prior art emitter and base.

FIG. 5 is a diagram showing the diffusion profile of a base in an embodiment of the present invention.

FIG. 6 is a diagram showing the diffusion profile of a base and emitter in an embodiment of the present invention.

FIG. 7 is a characteristic diagram of the reverse voltage resistance of an emitter and base in an embodiment of the present invention.

DETAILED DESCRIPTION OF THE PREFERRED EMBODIMENT

In a first embodiment of the invention, an N type semiconductor silicon wafer having a substantially flat surface is prepared. The whole surface of this N type semiconductor wafer is covered with an oxide film, and the oxide film is removed so as to expose the wafer in the region corresponding to the P type base layer that is formed afterwards. A gaseous mixture of boron (B) and arsenic (As) is made to flow, with a gaseous flow rate ratio of about 4:1, and in this atmosphere a boron doped silicate glass layer, that is to say a BSG layer about 5000 Å thick, is made to adhere to this exposed surface by the chemical vapor deposition method, that is to say the CVD method. After this, the mixed gas flow is stopped and an undoped layer is formed on this BSG layer. The semiconductor wafer with the BSG layer adhering is subjected to heat treatment at 1200° C. for several dozen minutes so that boron (B) and arsenic (As) contained in this BSG layer are diffused simultaneously to form a P type base layer of which the depth is 2.5μ or more. After this the BSG layer and the undoped layer thereon are removed.

The P type base layer can alsio be formed in the following way.

A BSG layer is formed on the region of the surface of the semiconductor wafer where the base region is to be formed, and a BSG layer containing arsenic is formed on the region of the surface where the emitter region is to be formed. The BSG layers containing these impurities are covered by an undoped layer. After that the semiconductor wafer is subjected to heat treatment so that the arsenic and boron contained in the BSG layers are diffused in the semiconductor wafer and form the P type base layer. After this, the BSG layer containing impurities is removed over the whole surface. After that, an oxide film coating is formed on the exposed surface of this semiconductor wafer. Part of the region of the P type base layer formed in this semiconductor wafer, that is to say the region in which the emitter layer is to be formed, is exposed.

Next, a gaseous mixture of phosphorus (P) and arsenic (As) is made to flow, with a gaseous flow rate ratio of about 4:1, while a CVD layer is being formed as a coating on the exposed surface of the P type base layer, so that a CVD layer containing phosphorus and arsenic, that is to say a PSG layer, is formed. The semiconductor wafer with this PSG layer as a coating is subjected to heat treatment at about 1100° C. for about 10 minutes and an emitter slump is made, an N type emitter layer with a depth of about 1.5μ is formed. Electrodes are formed respectively in the N type collector layer, the P type base layer and the N type emitter layer formed in this way, so that a semiconductor device is obtained which comprises a transistor consisting of the N type collector layer, the P type base layer and the N type emitter layer.

Figure 1:
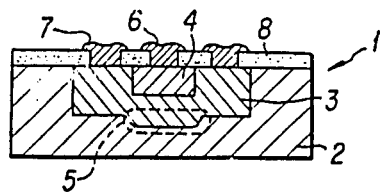
FIG. 1 is a sectional drawing of a prior art transistor.
Figure 2:
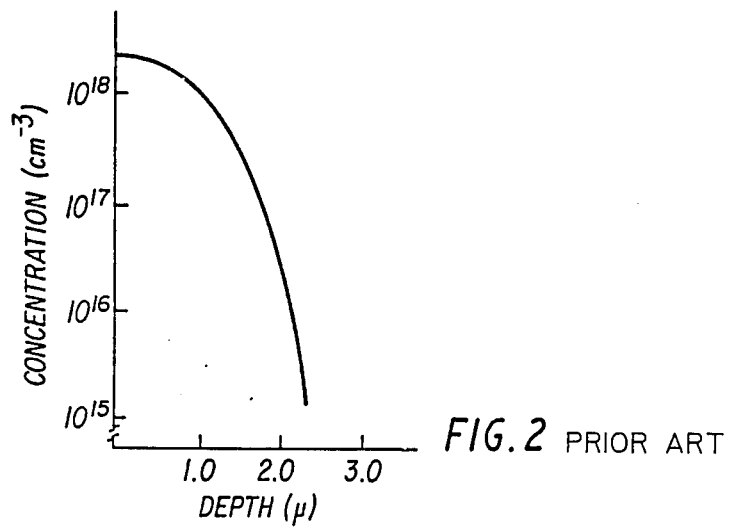
FIG. 2 is a diagram showing the diffusion profile of a prior art base.

FIG. 2 and FIG. 5 show the P type impurity concentration of the P type base layer and the relationship of this with the depth of diffusion of the impurity, before the N type emitter layer is formed, in the prior art and in accordance with the present invention, respectively. As compared with the prior art, in the present invention the P type impurity concentration of the P type base layer is substantially uniform with respect to the depth of diffusion, and there is nearly step form. This is because arsenic (As), which is an N type impurity of which the energy of combination with vacancies is great, is contained in the P type base layer.

Figure 3:
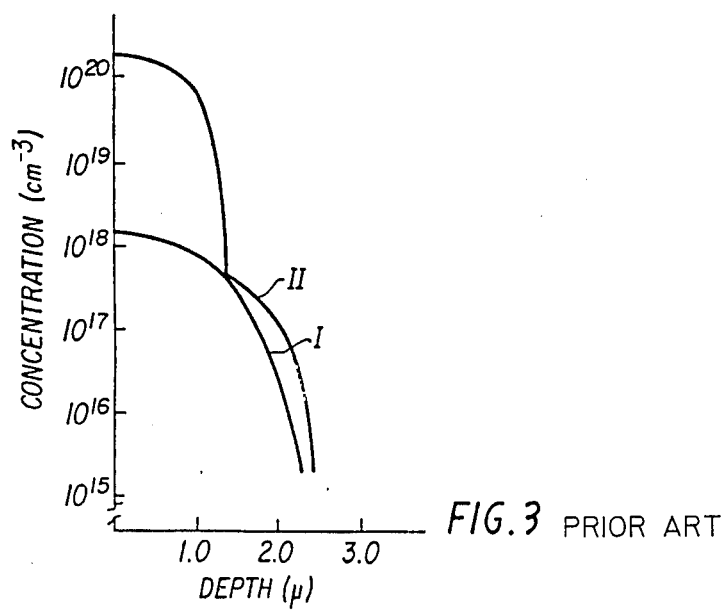
FIG. 3 is a diagram showing the diffusion profile of a prior art base and emitter.

FIG. 3 and FIG. 6 show the impurity concentrations of the N type emitter layer and the P type base layer and the relationships of these with the depth of diffusion, in the prior art and in accordance with the present invention, respectively. I is the diffusion profile of the base elsewhere than directly below the emitter layer, and II is the diffusion profile of the emitter and of the base directly below this. In the diffusion profile of the prior art base a difference is observed between I and II and this becomes the emitter dip region, but in the diffusion profile of the base of the present invention no difference is found between I and II. That is to say, in the present invention the emitter dip phenomenon is prevented. Because of the N type impurity arsenic (As) used when the P type base is formed, the diffusion profile of the emitter of the present invention has a more gradual slope in the direction of the depth of diffusion.

FIG. 4 and FIG. 7 show the reverse voltage resistance characteristic, that is to say the relationship between reverse current in amperes and reverse bias voltage in volts, between emitter and base in the prior art and between those made in accordance with the present invention, respectively.

It appears that the crystal defects in the vicinity of the PN junction between the emitter and the base of the transistor of the present invention are reduced by the formation of (As-V) pairs with the N type impurity of which the energy of combination with vacancies is great, and because of this the reverse voltage resistance characteristic is improved. Also, this is not confined to the vicinity of the PN junction between the emitter and the base; something similar also happens in the vicinity of the PN junction between the base and the collector, and the generation-recombination current, that is to say the G-R current of this PN junction is also reduced. As a result of this it is possible to make a low noise transistor which is better in this respect than the prior art transistors; it is possible to make a 1 to 4 dB low noise transistor which is about 6 dB lower than in the prior art.

Next, as another embodiment of the present invention we describe a case in which the P type impurity boron (B) and the N type impurity arsenic (As) are diffused separately when the P type base layer is formed. An N type semiconductor layer is prepared which is coated with an oxide film that is removed in one region; arsine (AsH$_3$) gas is made to flow, and by the CVD method an arsenic doped layer is formed by deposition on the exposed surface of this N type semiconductor layer. Arsenic (As) in the arsenic doped layer is diffused into the N type semiconductor wafer by heat treatment at about 1000° C. After this, the arsenic doped layer is removed and while diborane ($B_2H_6$) gas is being made to flow a boron doped layer is formed by deposition on the exposed surface of the N type semiconductor wafer. The N type semiconductor wafer coated with this boron doped layer is subjected to heat treatment at about 1200° C. for several dozen minutes so that a P type base layer is formed. The boron doped layer forming a coating on the surface of the P type base layer of the semiconductor wafer is removed. An N type emitter layer is formed in the semiconductor wafer in which this P type base layer has been formed; as regards this, however, the emitter layer is formed in the same way as in the previously described embodiment of the present invention.

Another embodiment of the present invention in which a P type base layer is formed will now be described. A substantially flat surface of an N type semiconductor wafer is coated with an oxide film. Resist is applied to the surface of this oxide film formed elsewhere than in the region in which the P type base layer is to be formed. With this resist as a mask, boron (B) and then arsenic (As) are implanted into the oxide film by the ion implantation method, and a doped oxide layer is formed. In the ion implantation of the impurities into the oxide film, either of the impurities may be introduced first by ion implantation so as to form the doped oxide film. The semiconductor wafer on which this doped oxide layer has been formed is subjected to heat treatment so that a P type base is formed. Boron (B) and arsenic (As) are simultaneously diffused from this doped oxide layer to form the P type base layer; alternatively, however, an N type layer containing arsenic may be formed in the semiconductor wafer by means of an arsenic doped oxide layer made by ion implantation, and then a P type base layer containing boron may be formed in the semiconductor wafer by means of a boron doped layer made by ion implantation. Also, in order to form the doped layer the ion implantation method and the CVD method may be combined to form the doped layer, and this may be subjected to heat treatment to form the P type base layer.

In the foregoing description the N type impurity material used in forming the P type base was arsenic (As), but this is not confined to arsenic; an N type impurity material of which the energy of combination with the vacancies present in the semiconductor wafer is great; for example antimony (Sb), is suitable. This antimony forms (Sb-V) pairs with the vacancies.

When the present invention is used the emitter dip phenomenon in the transistor is prevented. The N type impurity material of which the energy of combination with the vacancies is great diffuses deeply into the P type base layer. It appears that because of the deep diffusion of this N type impurity material, the ($P+-V=$) pairs that are produced when the N type emitter layer is formed are prevented from diffusing deeply into the semiconductor wafer, and also as regards the vacancies taken deeply in, and pairs including these vacancies, the emitter dip phenomenon is prevented by the "suction effect". Because of this prevention of the emitter dip phenomenon, electric field concentration does not occur readily in this semiconductor device, and therefore the voltage resistance characteristic of this device is improved. Now, N type impurity material of which the energy of combination with vacancies is great, more particularly arsenic (As), is contained in low concentration in the P base layer, whereby the P type impurity concentration distribution in the direction of the depth of the P type base layer is made uniform, and vacancies are captured by this N type impurity, and the effect of vacancies on the current flowing through the P type base layer of this semiconductor device is reduced. The noise therefore becomes low.

Also, by the use of arsenic (As) as an N type impurity the crystal strains due to the difference between the diameters of the atoms of the silicon of the semiconductor and of the N type impurity phosphorus (P) can be relaxed because the semiconductor contains this arsenic. Moreover the N type impurity material contained in the P type base layer combines with the vacancies and forms pairs, whereby the emitter-base and base-collector reverse voltage resistance characteristics of this transistor are improved and the generation-recombination currents of these PN junctions are reduced.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a semiconductor device consisting of:
   providing an N type collector layer in a semiconductor wafer having a substantially flat surface;
   diffusing an N type impurity having a high energy of combination with vacancies and a P type impurity such that a P type base layer is formed in contact with said N type collector layer having a PN junction extending to said surface; and
   diffusing at least phosphorus which is N type impurity into said P type base layer so that an N type emitter layer is formed which is in contact with said P type base layer having a PN junction extending to said surface and which constitutes a transistor together with said N type collector layer and said P type base layer.

2. A method of manufacturing a semiconductor device consisting of:
   providing an N type collector layer in a semiconductor wafer having a substantially flat surface;
   diffusing an N type impurity having a high energy of combination with vacancies and boron which is a P type impurity such that a P type base layer is formed in contact with said N type collector layer having an PN junction extending to said surface; and
   diffusing phosphorus and arsenic which are N type impurities into said P type base layer so that an N type emitter layer is formed which is in contact with said P type base layer having a PN junction extending to said surface and which constitutes a transistor together with said N type collector layer and said P type base layer.

3. A method of manufacturing a semiconductor device comprising:
   providing an N type collector layer in a silicon semiconductor wafer having a substantially flat surface;
   covering said N type collector layer with an oxide layer;

applying resist to the surface of said oxide layer formed elsewhere run in a region in which a P type base layer is to be formed;

implanting an N type impurity having a high energy of combination with vacancies and a P type impurity into said oxide layer using said resist as a mask by ion implantation such that a doped oxide layer is formed;

subjecting said doped oxide layer to heat treatment such that a P type base layer is formed in contact with said N type collector layer having a PN junction extending to said surface; and diffusing at least phosphorus which is N type impurity into said P type base layer so that an N type emitter layer is formed which is in contact with said P type base layer having a PN junction extending to said surface and which constitutes a transistor together with said N type collector layer and said P type base layer.

4. A method of manufacturing a semiconductor device comprising:

providing an N type collector layer in a silicon semiconductor wafer having a substantially flat surface;

covering said N type collector layer with an oxide layer;

applying resist to the surface of said oxide layer formed elsewhere than in a region in which a P type base layer is to be formed;

implanting an N type impurity having a high energy of combination with vacancies and boron which is a P type impurity into said oxide layer by ion implantation with said resist as a mask such that a doped oxide layer is formed;

subjecting said doped oxide layer to heat treatment such that a P type base layer is formed in contact with said N type collector layer having a PN junction extending to said surface; and diffusing phosphorus and arsenic which are N type impurities into said P type base layer so that an N type emitter layer is formed which is in contact with said P type base layer having a PN junction extending to said surface and which constitutes a transistor together with said N type collector layer and said P type base layer.

5. A method of manufacturing a semiconductor device which comprises the steps of:

providing an N type collector layer in an N type semiconductor wafer having a substantially flat surface;

coating said N type collector layer with a first oxide film layer;

implanting boron and an N type impurity having a high energy of combination with vacancies into a controlled region of said first oxide film layer;

diffusing boron and said N type impurity from said first oxide film layer into said N type collector layer such that a P type base layer in contact with said N type collector layer is formed having a PN junction extending to said surface;

removing said first oxide film layer from said semiconductor wafer;

covering said N type collector layer and said P type base layer with a second oxide film layer;

forming an opening in said second oxide film layer; and diffusing phosphorus and arsenic which are N type impurities through said opening in said second oxide layer into said P type base layer such that an N type emitter layer is formed which is in contact with said P type base layer having a PN junction extending to said surface and which constitutes a transistor together with said N type collector layer and said P type base layer.

6. A method of manufacturing a semiconductor device which comprises the steps of:

providing an N type collector layer in an N type semiconductor wafer having a substantially flat surface;

coating said N type collector layer with a first oxide film layer;

implanting an N type impurity having a high energy of combination with vacancies into a controlled region of said first oxide film layer;

diffusing said N type impurity from said first oxide layer into said N type collector layer;

implanting boron into said controlled region of said first oxide film layer;

diffusing boron from said first oxide layer into said N type collector layer such that a P type base layer in contact with said N type collector layer is formed having a PN junction extending to said surface;

removing said first oxide layer from said semiconductor wafer;

covering said N type collector layer and said P type base layer with a second oxide film layer;

forming an opening in said second oxide film layer;

diffusing phosphorus and arsenic which are N type impurities through said opening in said second oxide layer into said P type base layer such that an N type emitter layer is formed which is in contact with said P type base layer having a PN junction extending to said surface and which constitutes a transistor together with said N type collector layer and said P type base layer.

7. A method of manufacturing a semiconductor device as recited in any of claims 3, 4, 5 or 6, wherein: said N type impurity having a high energy of combination with vacancies is arsenic.

8. A method of manufacturing a semiconductor device as recited in any of claims 3, 4, 5, or 6 wherein: said N type impurity having a high energy of combination with vacancies is antimony.

* * * * *